(12) United States Patent
Gu et al.

(10) Patent No.: US 9,893,323 B2
(45) Date of Patent: Feb. 13, 2018

(54) METHOD FOR PREPARING OLED AND OLED DEVICE

(71) Applicant: BOE TECHNOLOGY GROUP CO., LTD., Beijing (CN)

(72) Inventors: Pengfei Gu, Beijing (CN); Fengjuan Liu, Beijing (CN); Hongda Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/208,446

(22) Filed: Jul. 12, 2016

(65) Prior Publication Data

US 2017/0250378 A1  Aug. 31, 2017

(30) Foreign Application Priority Data

Feb. 26, 2016  (CN) .......................... 2016 1 0109742

(51) Int. Cl.
*H01L 51/56* (2006.01)
*H01L 51/50* (2006.01)
*H01L 51/52* (2006.01)
*H01L 51/00* (2006.01)

(52) U.S. Cl.
CPC .......... *H01L 51/56* (2013.01); *H01L 51/0023* (2013.01); *H01L 51/5088* (2013.01); *H01L 51/5092* (2013.01); *H01L 51/5206* (2013.01); *H01L 2251/303* (2013.01)

(58) Field of Classification Search
CPC . H01L 51/56; H01L 51/0023; H01L 51/5088; H01L 51/0092; H01L 51/5206
See application file for complete search history.

(56) References Cited

U.S. PATENT DOCUMENTS

| 2011/0042656 | A1* | 2/2011 | Burroughes | ........ H01L 27/3246 257/40 |
| 2014/0131690 | A1* | 5/2014 | Kondo | ................ H01L 51/5203 257/40 |
| 2015/0001519 | A1* | 1/2015 | Matsuura | ................ H01L 33/38 257/40 |
| 2015/0069358 | A1 | 3/2015 | Chida et al. | |

FOREIGN PATENT DOCUMENTS

| CN | 101728314 A | 6/2010 |
| CN | 103996800 A | 8/2014 |
| CN | 104037336 A | 9/2014 |

OTHER PUBLICATIONS

Office Action in Chinese Application No. 201610109742.7 dated Feb. 4, 2017, with English translation. 7 pages.
Office Action in Chinese Application No. 201610109742.7 dated Jun. 2, 2017, with English translation.

* cited by examiner

*Primary Examiner* — Phuc Dang
(74) *Attorney, Agent, or Firm* — Blakely Sokoloff Taylor & Zafman LLP

(57) ABSTRACT

A method for preparing an OLED and an OLED device are provided. The method for preparing an OLED comprises forming an anode metal layer on an organic layer; forming an inorganic layer on the anode metal layer; and forming the anode metal layer into an anode layer comprising a pattern of an anode.

12 Claims, 3 Drawing Sheets

METHOD FOR PREPARING OLED AND OLED DEVICE

RELATED APPLICATIONS

The present application claims the benefit of Chinese Patent Application No. 201610109742.7, filed Feb. 26, 2016, the entire disclosure of which is incorporated herein by reference.

TECHNICAL FIELD

The present invention relates to the display field, and especially to a method for preparing an OLED and an OLED device.

BACKGROUND

The current display types mainly include liquid crystal display (LCD), organic light-emitting diode (OLED) display, plasma display panel (PDP), electronic ink display, and so on. The OLED display is generally acknowledged in the industry as the third-generation display technology after the LCD display due to its advantages including lightness and thinness, active luminescence, quick response speed, large viewing angle, abundant color, high brightness, low power consumption, high and low temperature resistance, and the like, and can be widely applied in terminal products such as intelligent mobile phone, tablet computer and television.

The OLED with an organic substrate has excellent characteristics of the traditional OLED, while good flexibility of the organic substrate enables it to have a more attractive application prospect in both performance and use. However, after a patterned anode layer has been formed on the organic substrate, when an inorganic layer is deposited on the anode layer using plasma enhanced chemical vapor deposition (PECVD) method, since the substances or gases during the preparation of the inorganic layer would react with the organic substrate (for example, in the course of preparing an $SiO_2$ thin film from the reaction $SiH_4+2N_2O \rightarrow SiO_2+2N_2+2H_2$ by employing $SiH_4$ and $N_2O$ as gas sources using PECVD method, the $N_2O$ gas used during the reaction would react with the organic substrate), holes would be generated in the organic substrate, and the holes generated in the organic substrate would result in failure of the OLED.

SUMMARY

It is an objective of embodiments of the present invention to provide a method for preparing an OLED and an OLED device to alleviate or solve one or more of the above problems or other problems.

Embodiments of the present invention provide a method for preparing an OLED, which comprises steps of:

forming an anode metal layer on an organic layer;

forming an inorganic layer on the anode metal layer; and forming the anode metal layer into an anode layer comprising a pattern of an anode.

For example, the step of forming the anode metal layer into an anode layer comprising a pattern of an anode comprises: forming a photoresist on the inorganic layer such that the photoresist forms a same pattern as the anode; patterning the inorganic layer; and forming the anode metal layer into the anode layer.

For example, the step of patterning the inorganic layer comprises: patterning the inorganic layer by dry etching using the photoresist as a mask.

For example, the step of forming the anode metal layer into the anode layer comprises: patterning the anode metal layer by wet etching using the photoresist and the inorganic layer as masks.

For example, the step of forming the inorganic layer on the anode metal layer comprises: forming the inorganic layer on the anode metal layer by plasma enhanced chemical vapor deposition.

For example, the step of forming the inorganic layer on the anode metal layer further comprises: after forming the inorganic layer, etching the inorganic layer to form a patterned inorganic layer, wherein the patterned inorganic layer exposes the anode metal layer at an opening.

For example, the step of forming the anode metal layer into the anode layer comprising the pattern of an anode comprises: forming a photoresist on the patterned inorganic layer such that the photoresist forms a same pattern as the anode; patterning the inorganic layer; and forming the anode metal layer into the anode layer.

For example, the organic layer is an organic substrate.

For example, the material of the anode is silver, aluminum or copper.

For example, the material of the inorganic layer is silicon oxide.

Embodiments of the present invention provide an OLED device prepared by said method, wherein the OLED device comprises: an organic layer; an anode layer formed on the organic layer which comprises a pattern of an anode; and an inorganic layer formed on the anode layer, wherein the inorganic layer is patterned to partly expose the anode.

For example, the organic layer is an organic substrate.

For example, the material of the anode is silver, aluminum or copper.

For example, the material of the inorganic layer is silicon oxide.

DETAILED DESCRIPTION OF EMBODIMENTS

The process of implementing embodiments of the present invention is set forth below in detail with reference to the drawings. It is to be noted that the same or similar reference signs represent the same or similar elements or elements having the same or similar functions throughout the present invention. The embodiments described below with reference to the drawings are exemplary, which can only be used for interpreting the present invention but cannot be construed as limitation to the present invention.

Figure 1:
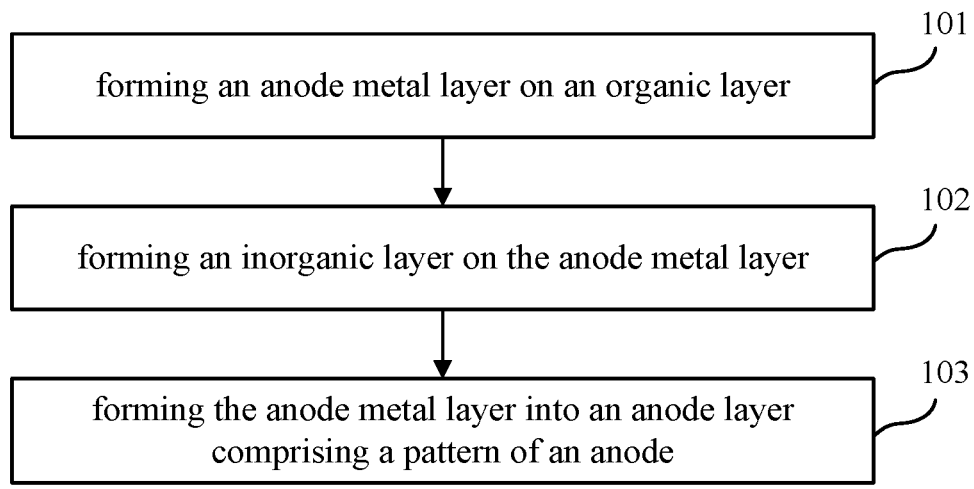
FIG. 1 is a flow chart of a method for preparing an OLED as provided by embodiments of the present invention.

Embodiments of the present application provide a method for preparing an OLED, comprising steps of forming an anode metal layer on an organic layer and forming the anode metal layer into an anode layer comprising a pattern of an anode; prior to forming the anode metal layer into an anode layer comprising a pattern of an anode, forming an inorganic layer on the anode metal layer. For example, referring to FIG. 1, said method comprises steps of:

101 forming an anode metal layer on an organic layer;
102 forming an inorganic layer on the anode metal layer;
103 forming the anode metal layer into an anode layer comprising a pattern of an anode.

In accordance with said embodiment, the inorganic layer is first formed on the anode metal layer. The anode metal layer protects and isolates the organic layer during the formation of the inorganic layer such that the substances or gases during the preparation of the inorganic layer would not contact the organic layer so as to avoid formation of holes in the organic layer to improve the quality of the OLED.

Figure 2:
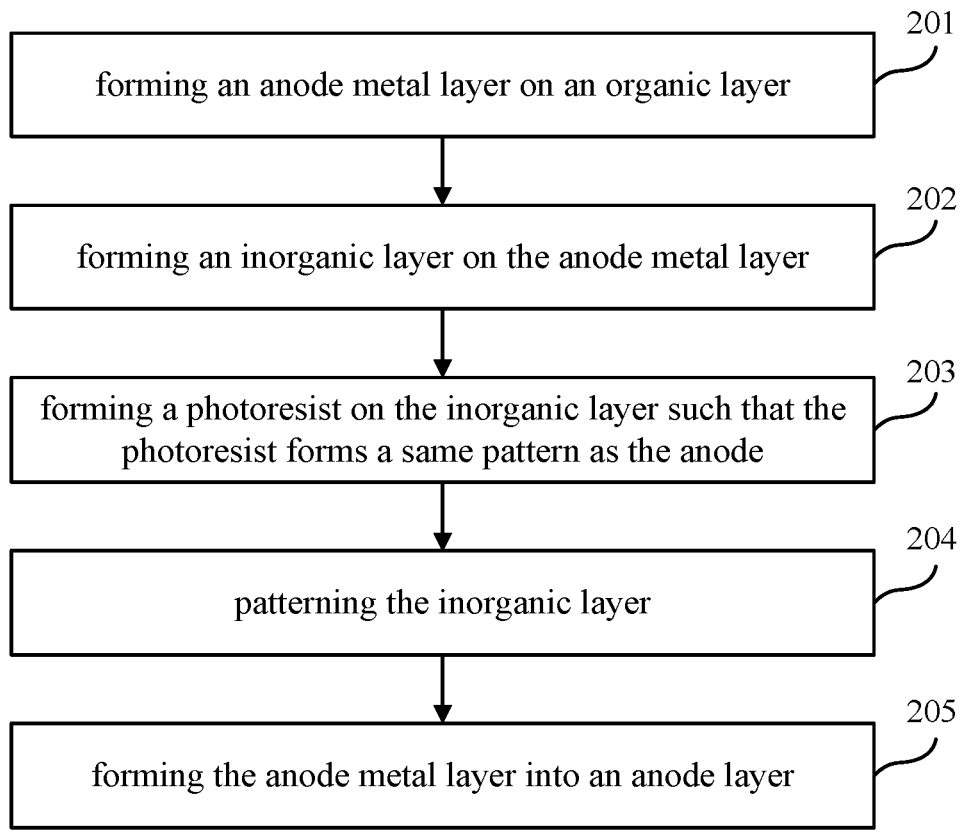
FIG. 2 is a flow chart of an exemplary method for preparing an OLED as provided by embodiments of the present invention.

Referring to FIG. 2, embodiments of the present invention further provide an exemplary method for preparing an OLED, comprising:

201 forming an anode metal layer on an organic layer. The organic layer is, for example, an organic substrate of the OLED or is, for example, polyethylene terephthalate (PET), polyethylene naphthalate two formic acid glycol ester (PEN), polyetheretherketone (PEEK), polyethersulfone resin (PES) and polycarbonate (PC) or a composite organic substrate containing such materials.

For example, the anode metal layer is formed on the organic layer by a method such as vacuum evaporation, magnetron sputtering or chemical vapor deposition, etc, and the formed anode metal layer covers the underlying organic layer. The material of the formed metal layer and the thickness of the layer are flexibly set based on needs. For example, the material of the metal layer is silver, aluminum or copper.

202 forming an inorganic layer on the anode metal layer.

For example, the inorganic layer is formed on the anode layer using plasma enhanced chemical vapor deposition. The material of the inorganic layer is silicon oxide, for instance, SiO or $SiO_2$. For example, an $SiO_2$ thin film is formed in a plasmas environment by employing $SiH_4$ and $N_2O$ as gas sources using PEVCD: $SiH_4+2N_2O \rightarrow SiO_2+2N_2+2H_2$. $N_2O$ is a gas that would react with the organic layer. Since the anode metal layer covers the organic substrate, $N_2O$ would not contact the organic layer during the formation of the $SiO_2$ thin film using $SiH_4$ and $N_2O$ as gas sources, thereby preventing the reaction of $N_2O$ with the organic layer during the preparation of the $SiO_2$ thin film which results in generation of holes in the organic layer.

203 forming a photoresist on the inorganic layer such that the photoresist forms a same pattern as the anode. For example, the photoresist forms a same pattern as the anode by patterning process (e.g. exposure, development).

204 patterning the inorganic layer. In an exemplary embodiment, the inorganic layer is patterned by dry etching.

205 forming the anode metal layer into an anode layer. In an exemplary embodiment, the anode metal layer forms an anode layer by wet etching.

In accordance with said embodiment, the inorganic layer is first formed on the anode metal layer. The anode metal layer protects and isolates the organic layer during the formation of the inorganic layer such that the substances or gases during the preparation of the inorganic layer would not contact the organic layer so as to avoid formation of holes in the organic layer to improve the quality of the OLED.

To describe the method for preparing an OLED according to the present invention more clearly, explanation is made in detail below with reference to FIGS. 3-9.

Figure 3:
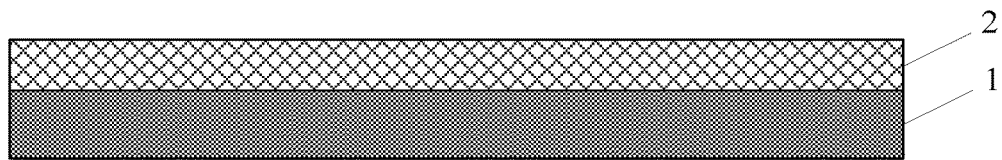
FIG. 3 is a schematic diagram of forming a metal layer on the organic layer, in embodiments of the present invention.

Step 1, an anode metal layer 2 is formed on an organic layer 1, as shown in FIG. 3.

For example, the anode metal layer 2 is formed on the organic layer 1 by a method such as vacuum evaporation, magnetron sputtering or chemical vapor deposition, etc, wherein the formed anode metal layer 2 covers the underlying organic layer 1. The material of the formed anode metal layer 2 and the thickness of the layer are flexibly set based on needs. For example, the material of the metal layer is silver, aluminum or copper.

Figure 4:
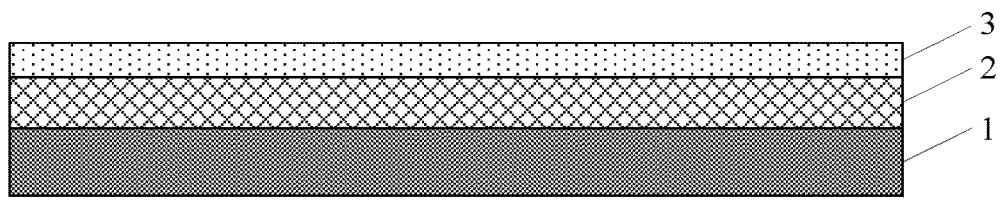
FIG. 4 is a schematic diagram of forming an inorganic layer on the metal layer, in embodiments of the present invention.
Figure 5:
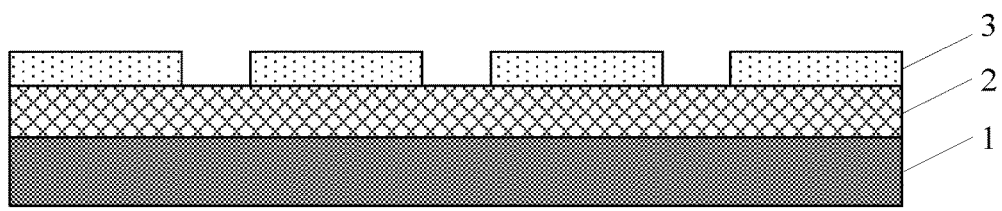
FIG. 5 is a schematic diagram of the inorganic layer after it has been etched, in embodiments of the present invention.

Step 2, an inorganic layer 3 is formed on the anode metal layer 2, as shown in FIGS. 4-5.

For example, the inorganic layer 3 is formed on the anode metal layer 2 using PECVD method, as shown in FIG. 4. Thereafter, the inorganic layer 3 is etched to form an inorganic layer 3 as shown in FIG. 5.

Figure 9:
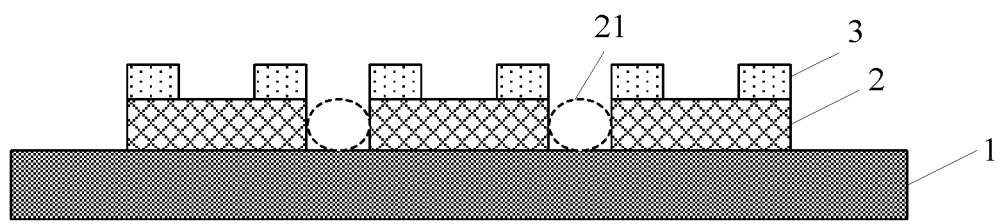
FIG. 9 is a schematic diagram of the situation after removal of the photoresist, in embodiments of the present invention.

In an exemplary embodiment, the material of the inorganic layer 3 is silicon oxide, for instance, SiO or $SiO_2$. For example, an $SiO_2$ thin film is formed on the anode metal layer 2 in a plasmas environment from the reaction $SiH_4+2N_2O \rightarrow SiO_2+2N_2+2H_2$ by employing $SiH_4$ and $N_2O$ as gas sources using PEVCD method, wherein $N_2O$ is a gas that would react with the organic layer. If the anode metal layer 2 is patterned first (for example, to form an anode metal layer 2 as shown in FIG. 9) prior to forming an $SiO_2$ thin film on the anode metal layer 2, at the time of forming the $SiO_2$ thin film, the $N_2O$ gas is likely to react with the organic layer 1 by means of a gap (e.g. gap 21 as shown in FIG. 9) of the patterned anode metal layer 2, resulting in formation of holes in the organic layer 1. In the present embodiment, since the anode metal layer 2 covers the organic substrate 1, $N_2O$ would not contact the organic layer 1 at the time of forming the $SiO_2$ thin film using $SiH_4$ and $N_2O$ as gas sources, thereby preventing the reaction of $N_2O$ with the organic layer 1 during the preparation of the $SiO_2$ thin film which results in generation of holes in the organic layer 1.

Figure 6:
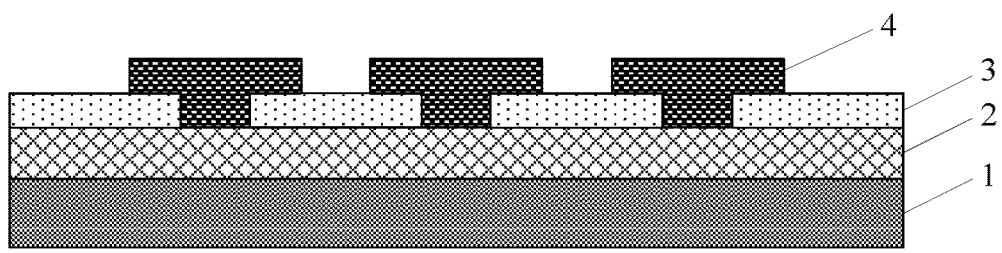
FIG. 6 is a schematic diagram of the inorganic layer on which a photoresist layer has been formed, in embodiments of the present invention.

Step 3, a photoresist layer 4 as shown in FIG. 6 is formed on the inorganic layer 3 to form the photoresist layer 4 into a same pattern as the anode. For example, the photoresist layer 4 is formed as a photoresist layer 4 as shown in FIG. 6 by patterning process (e.g. exposure, development). The photoresist layer 4 has a same pattern as the anode subsequently formed.

Figure 7:
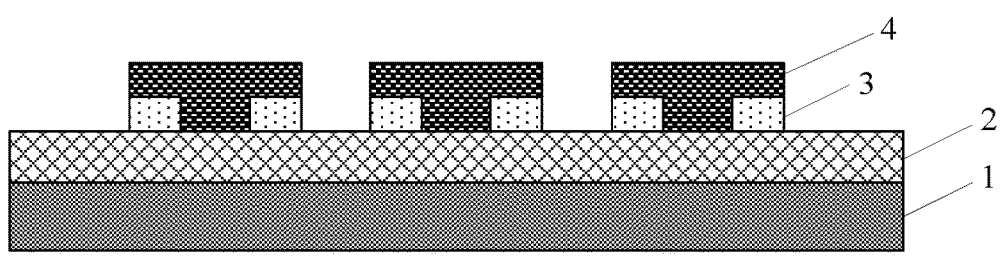
FIG. 7 is a schematic diagram of the inorganic layer in which the parts not shielded by the photoresist have been dry etched, in embodiments of the present invention.

Step 4, the inorganic layer 3 is patterned, as shown in FIG. 7. In an exemplary embodiment, the inorganic layer 3 not shielded by the photoresist is patterned by dry etching to form an inorganic layer 3 as shown in FIG. 7.

Figure 8:
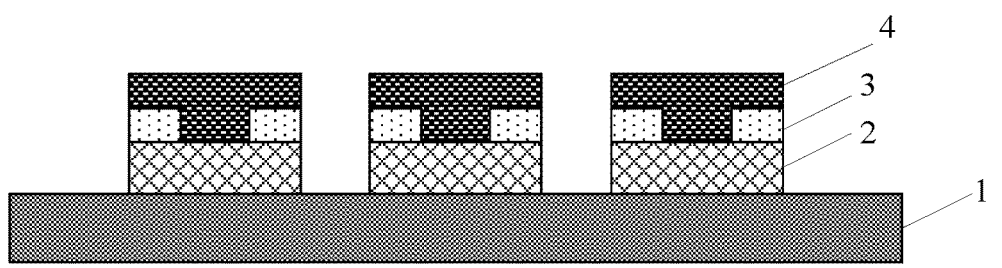
FIG. 8 is a schematic diagram of the anode metal layer in which the parts not shielded by the photoresist have been wet etched, in embodiments of the present invention.

Step 5, the anode metal layer 2 is patterned, as shown in FIG. 8. In an exemplary embodiment, the anode metal layer 2 is patterned by wet etching. For example, a suitable solution is selected according to the metal material of the anode to etch the anode metal layer 2 to form a pattern as shown in FIG. 8.

Step 6, the photoresist layer 4 is removed to complete the preparation of the anode metal layer 2 and the inorganic layer 3, as shown in FIG. 9.

As shown in FIG. 9, the patterned anode 9 is formed on the organic layer 1, and neighboring anodes 9 are spaced by the gap 21. The inorganic layer 3 is formed on each anode 2. The inorganic layer 3 is patterned to form a groove on the anode 9. During subsequent processes for the OLED device, functional layers, like a hoe injection layer, an organic light emitting layer and an electron injection layer, are formed in the groove of the inorganic layer 3 by a process like ink jet printing, thus forming OLED devices which are isolated from each other.

In accordance with said embodiment, the inorganic layer is first formed on the anode metal layer. The anode metal layer protects and isolates the organic layer during the formation of the inorganic layer such that the substances or gases during the preparation of the inorganic layer would not contact the organic layer so as to avoid formation of holes in the organic layer to improve the quality of the OLED.

Embodiments of the present invention provide an OLED device prepared by the method provided by the above embodiments of the present invention. The formed OLED device comprises an organic layer, an anode layer formed on the organic layer and an inorganic layer formed on the anode layer.

In an exemplary embodiment, the organic layer is a flexible OLED substrate, which, for example, is PET, PEN, PEEK, PES and PC or a composite organic substrate containing such materials.

In an exemplary embodiment, the material of the metal anode layer is silver, aluminum, copper, etc.

In an exemplary embodiment, the material of the inorganic layer is silicon oxide, for instance SiO or $SiO_2$.

In accordance with said embodiment, the inorganic layer is first formed on the anode metal layer. The anode metal layer protects and isolates the organic layer during the formation of the inorganic layer such that the substances or gases during the preparation of the inorganic layer would not contact the organic layer so as to avoid formation of holes in the organic layer to improve the quality of the OLED.

Obviously, those skilled in the art can make various modifications and variations to the present invention without departing from the spirit and scope thereof In this way, if these modifications and variations to the present disclosure pertain to the scope of the claims of the present invention and equivalent technologies thereof, the present invention also intends to encompass these modifications and variations.

What is claimed is:

1. A method for preparing an OLED, comprising steps of:
   forming an anode metal layer on an organic layer;
   forming an inorganic layer on the anode metal layer;
   etching the inorganic layer to form a patterned inorganic layer, wherein the patterned inorganic layer exposes the anode metal layer at an opening; and
   forming an anode layer comprising a pattern of an anode and the patterned inorganic layer on the anode, wherein the opening exposes the anode.

2. The method according to claim 1, wherein the step of forming the anode layer comprising the pattern of the anode and the patterned inorganic layer on the anode comprises:
   forming a photoresist on the patterned inorganic layer such that the photoresist forms a same pattern as the anode;
   patterning the patterned inorganic layer; and
   forming the anode metal layer into the anode layer.

3. The method according to claim 2, wherein the step of patterning the patterned inorganic layer comprises:
   patterning the patterned inorganic layer by dry etching using the photoresist as a mask.

4. The method according to claim 2, wherein the step of forming the anode metal layer into the anode layer comprises:
   patterning the anode metal layer by wet etching using the photoresist and the patterned inorganic layer as masks.

5. The method according to claim 1, wherein the step of forming the inorganic layer on the anode metal layer comprises:
   forming the inorganic layer on the anode metal layer by plasma enhanced chemical vapor deposition.

6. The method according to claim 1, wherein the organic layer is an organic substrate.

7. The method according to claim 1, wherein a material of the anode is silver, aluminum or copper.

8. The method according to claim 1, wherein a material of the inorganic layer is silicon oxide.

9. An OLED device prepared by the method according to claim 1, wherein the OLED device comprises:
   an organic layer;
   an anode layer formed on the organic layer which comprises a pattern of an anode; and
   an inorganic layer formed on the anode layer, wherein the inorganic layer is patterned to partly expose the anode.

10. The OLED device according to claim 9, wherein the organic layer is an organic substrate.

11. The OLED device according to claim 9, wherein a material of the anode is silver, aluminum or copper.

12. The OLED device according to claim 9, wherein a material of the inorganic layer is silicon oxide.

* * * * *